United States Patent [19]

Kovacs et al.

[11] Patent Number: 4,763,124
[45] Date of Patent: Aug. 9, 1988

[54] SIGNAL DISTRIBUTION SYSTEM HYBRID RELAY CONTROLLER/DRIVER

[75] Inventors: Eddie T. Kovacs, Kings Park; Donald J. Eivers, Massapequa, both of N.Y.

[73] Assignee: Grumman Aerospace Corporation, Bethpage, N.Y.

[21] Appl. No.: 836,927

[22] Filed: Mar. 6, 1986

[51] Int. Cl.$^4$ .................. H04Q 9/00; G01R 31/28
[52] U.S. Cl. .................. 340/825.800; 324/73 R
[58] Field of Search ............ 340/825, 825.8; 371/20; 324/73 R; 364/579

[56] References Cited

U.S. PATENT DOCUMENTS

| | | | |
|---|---|---|---|
| 2,580,082 | 12/1951 | Dimond | 371/11 |
| 2,841,748 | 7/1958 | Reynolds, Jr. | 361/192 |
| 2,991,454 | 7/1961 | Hammer | 340/825.79 |
| 3,097,353 | 7/1963 | Carter | 361/191 |
| 3,268,866 | 8/1966 | Vant Slot et al. | 340/825.79 |
| 3,317,897 | 5/1967 | Ceonzo et al. | 340/825.8 |
| 3,389,228 | 6/1968 | Haselton, Jr. | 340/825.89 |
| 3,414,882 | 12/1968 | Barron et al. | 340/825.89 |
| 3,435,417 | 3/1969 | Haselton, Jr. | 340/825.89 |
| 3,456,084 | 7/1969 | Haselton, Jr. | 340/825.89 |
| 3,573,388 | 4/1971 | Dagnall, Jr. | 340/825.89 |
| 3,651,468 | 3/1972 | Waaben | 340/825.8 |
| 3,761,689 | 9/1973 | Watanabe et al. | 340/825.79 |
| 3,784,879 | 1/1974 | Dukette | 361/192 |
| 3,902,101 | 8/1975 | Angner et al. | 361/192 |
| 4,088,845 | 5/1978 | Lalanne et al. | 340/825.79 |
| 4,293,735 | 10/1981 | Duret | 340/825.89 |
| 4,300,207 | 11/1981 | Eivers et al. | 364/900 |
| 4,345,251 | 8/1982 | Begeman et al. | 340/825.89 |
| 4,397,021 | 8/1983 | Lloyd et al. | 371/20 |
| 4,620,304 | 10/1986 | Faran, Jr. et al. | 324/73 R |
| 4,682,330 | 7/1987 | Millham | 324/73 R |

Primary Examiner—Donald J. Yusko
Attorney, Agent, or Firm—Pollock, VandeSande & Priddy

[57] ABSTRACT

A hybrid controller is used to control a plurality of relays, within a switching matrix, for effecting connection of an equipment under test to at least one of a plurality of test instruments. To do so, the hybrid controller utilizes latch drivers which are capable of driving 24 relays simultaneously. To check whether or not the correct relay is activated, drivers are used to sense the statuses of the relays and forward the information to a central processing unit for comparison. The drivers are controllably actuated by a decoder means, which in turn is controlled by the central processor.

10 Claims, 3 Drawing Sheets

SIGNAL DISTRIBUTION SYSTEM HYBRID RELAY CONTROLLER/DRIVER

FIELD OF THE INVENTION

The present invention relates in general to a signal distribution system, and more particularly to a hybrid IC controller used to control the relays in the signal distribution system (SDS).

BRIEF DESCRIPTION OF THE PRIOR ART

A predecessor to the current signal distribution system is the multiple matrix switching system, which has been thoroughly described in U.S. Pat. No. 4,300,207, issued to the present inventors and assigned to the same assignee herein, Grumman Aerospace Corporation. The present invention, like the multiple matrix switching system (MMS), is intended to be used as an automatic test equipment system for testing various avionic electronic systems and subsystems of an aircraft. Some other previous systems which were used include the radar communication test center (RADCOM) and the computer-automated test equipment, the analog version (CATA).

Typically, an equipment under test is taken off an aircraft and attached to an interface in any one of the previous systems. A switching subsystem within the different systems is then used to effect a connection between the equipment under test and any one or more of a myriad of test instruments. For example, were the equipment under test a signal locator, connections to both frequency and signal generators would be appropriate. The previous system would work adequately so long as the space available for these systems is unlimited—in terms of the number of IC chips which can be placed in an area having a certain dimension. However, as the number of equipment under test and the number of test instruments increase, miniaturization of the automatic testing system, such as those discussed hereinabove, is needed.

BRIEF DESCRIPTION OF THE PRESENT INVENTION

In accordance with the present invention, an automatic equipment testing system, to be referred hereafter as the signal distribution system (SDS), having miniaturized switching matrices and control means, is used to effect connection between the equipment under test and any one or more of a plurality of test instruments. The present invention is specifically confined to a hybrid IC controller which has the capability to communicate with a central computer, to control the relays in a corresponding switching matrix and to report the statuses of the relays to the central computer. To accomplish this, a number of relay drivers, an equal number of bus drivers and a select decoder are interconnected in the hybrid IC. As for the switching matrix, a full disclosure thereof is given in co-pending application Ser. No. 836,929 by the same inventors, and the present assignee.

When utilizing the present invention, the following objectives are realized:

1. A substantial reduction is achieved in the number of integrated circuits required for testing avionic equipment;

2. An improved economy of scale is achieved as more test instruments can be used to test more equipment; and 3. Because of the reduction in weight and size, a portable SDS is deemed to be feasible.

The above-mentioned objects and advantages of the present invention will become more apparent and the invention itself will be best understood by reference to the following description of an embodiment of the invention taken in conjunction with the accompanying drawings, wherein:

DETAILED DESCRIPTION OF THE PRESENT INVENTION

Figure 1:
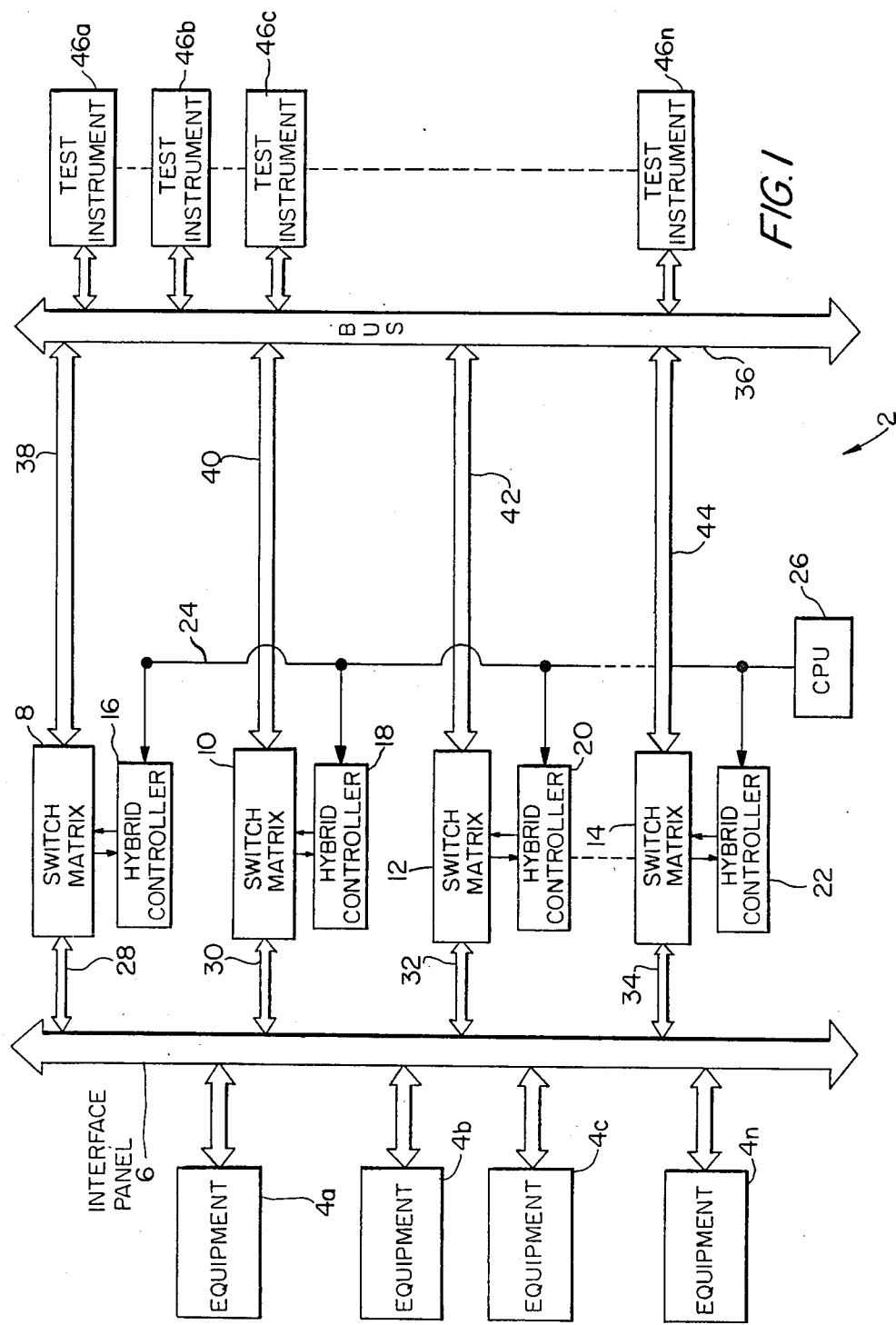
FIG. 1 shows an overall signal distribution system of the present invention.

Referring to FIG. 1, there is shown a signal distribution system designated 2. The equipment under test—for example, 4a—is connected to an interface panel 6. It should be appreciated that a multiple number of equipment can be connected to interface panel 6 as there are a multiple number of connections available therein. Within signal distribution system 2, a plurality of switch matrices, for this example switch matrices 8-14, are located. As was mentioned in the Brief Description of the Present Invention, these switch matrices are fully discussed in co-pending application titled "Signal Distribution System Switching Module." For now, suffice it to state that each of these switch matrices is identical and that there are a plurality of relays incorporated within each matrix, which relays can be selectively activated by at least one controller so that a particular test instrument can be selected therefrom.

For this signal distribution system, the controller which is used to activate the relays in the respective switch matrices are hybrid IC controllers 16-22. It should be appreciated that, although four sets of switch matrix-hybrid controller are shown, the signal distribution system is by no means limited only to four switch matrices or four hybrid controllers. It should further be noted that, although each switch matrix is shown to be controlled by only one hybrid controller, a multiple number of hybrid controllers can also be used t control a single switch matrix, as the number of inputs and outputs per hybrid controller can fluctuate. Irrespective of the numbers, the hybrid controllers are connected via common line 24 to central processing unit 26. Not to be missed are bi-directional data buses 28-34, each of which—for this example—has eight data lines. As drawn, to the right of these switch matrices is common bus line 36. Connecting the respective switch matrices to common bus line are bi-directional data lines 38-44. A number of test instruments 46a-46n are connected to common bus line 36 outside of signal distribution system 2. By judiciously actuating the relays in the respective switch matrices, connections can be made between a plurality of equipment under test to different or multiple test instruments. And the actuation of the relays in the respective switch matrices are done by hybrid controllers 16-22.

Figure 2:
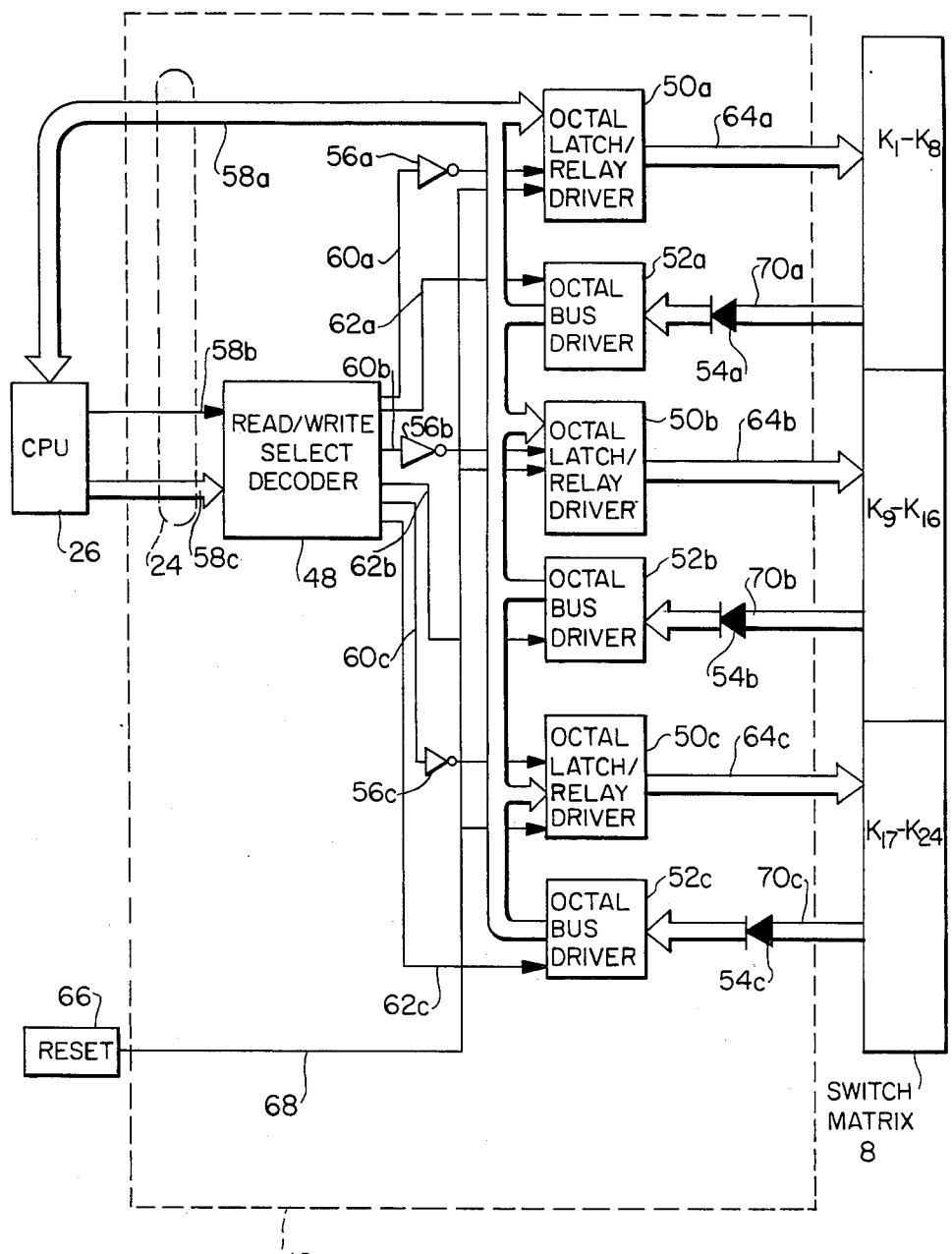
FIG. 2 is a block diagram of an embodiment of the present invention.

FIG. 2 illustrates a block diagram of a hybrid controller which constitutes the present invention. For the sake of clarity and because all of the hybrid controllers are identical, only hybrid controller 16 is shown. Before delving into a description of the hybrid controller, a moment is hereby taken to note that hybrid technology (used in the making of hybrid controllers) involves LSI integrated circuits, and particularly the putting into a package substrate a large number of dies representative of multiple LSI integrated circuits.

Within the dotted rectangle, which signifies hybrid controller 16, are select decoder 48, three relay drivers 50a–50c, three corresponding bus drivers 52a–52c, three isolation diodes 54a–54c and three inverters 56a–56c. Select decoder 48 has outputs 60a–60c connected to inverters 56a–56c, respectively. The outputs of the respective inverters are connected as inputs to corresponding relay drivers 50a–50c. Select decoder 48 further has outputs 62a–62c connected as inputs to bus drivers 52a–52c, respectively. The hybrid controller interfaces with central processing unit 26 by means of line 24, shown as a dotted ring. Within line 24 are data lines 58a, address line 58b and decode and enable lines 58c. Within data lines 58a are eight bi-directional data lines, all connected to relay drivers 50a–50c and bus drivers 52a–52c. Address line 58b is used by central processing unit 26 for addressing the select decoder, and decode and enable lines 58c are used to send data to select decoder 48 for determining which relay(s) in a switch matrix is (are) to be activated. Relay drivers 50a to 50c are connected to switch matrix 8 by means of uni-directional buses 64a–64c, respectively. For this embodiment, each of the relay drivers is capable of actuating eight relay coils. For example, relay driver 50a is capable of activating relays $K_1$–$K_8$; relay driver 50b is capable of activating relays $K_9$–$K_{16}$; and relay driver 50c is capable of actuating relays $K_{17}$–$K_{24}$. Although not shown in FIG. 1, a reset 66 can be used to set all of the relay drivers into an initial state via line 68.

It should be appreciated that the relay drivers can be made from UNC5801 dies, the bus drivers can be made from 74LS540 dies and the select decoder can be manufactured from a 74LS138 semiconductor die. All of the above-mentioned dies are made by a number of companies, including, for example, the Sprague Corporation and Signetics, Inc.

In operation, the hybrid controller works as follows. From data lines 58a, CPU 26 feeds instruction data to relay drivers 50a–50c. Meanwhile, dependent on which of the relays $K_1$–$K_{24}$ is (are) deemed by central processor unit 26 as candidate(s) for activation, per instructions fed therein by software which, incidentally, can easily be formulated by one skilled in the art and an analog of which is demonstrated in aforecited U.S. Pat. No. 4,300,207, central processing unit 26 then sends the addressing data via line 58b and the decoding and enabling data via lines 58c to select decoder 48. Using these data, select decoder 48 is able to send out enabling signals to any one of relay drivers 50a–50c. Because of the nature of the semiconductors, inverters 56a–56c are needed for converting the outputs from select decoder 48 to an opposite sense before feeding them to the respective relay drivers. It should also be noted at this point that the decoding and enabling lines 58c may actually be comprised of three lines, namely a chip select line, an enable line and a read and write line. Thus, select decoder 48 is able to select the relay driver which is to receive the instruction data fed from line 58a. The instruction data is then written into that particular octal-relay driver, thereby leading to the energizing of a relay located at a particular location in switch matrix 8. As there are three relay drivers, each of which is capable of controlling eight relays, a total of 24 relays can be controlled by a single hybrid controller.

Having put the data into the proper latch/relay driver to drive the particular relay, a second aspect of the present invention pertains to the ability of the hybrid controller to determine whether or not those relays are indeed being driven. This aspect of the invention is realized by incorporating bus drivers 52a–52c. As shown, bus drivers 52a–52c are connected to relays $K_1$–$K_8$, $K_9$–$K_{16}$ and $K_{17}$–$K_{24}$, respectively, via corresponding lines 70a–70c. Because the input voltage capability of the respective bus drivers is fairly low, isolation diodes 54a–54c are placed before the inputs of bus drivers 52a–52c, respectively, to prevent higher than permissible voltages from entering the bus drivers.

After the relays have been activated, one of bus drivers 52a–52c reads the statuses of the relays. Whichever bus driver is used depends, of course, on whichever set of relays is activated. Albeit it is shown that the status of a relay is read via lines 70a–70c, it should be appreciated that these lines can be incorporated into lines 64a–64c, respectively. The status of the respective relays is sent via lnes 58a to central processing unit 26, wherein a comparison of the relay(s) which should be activated and the relay(s) which actually is (are) activated is made.

Figure 3:
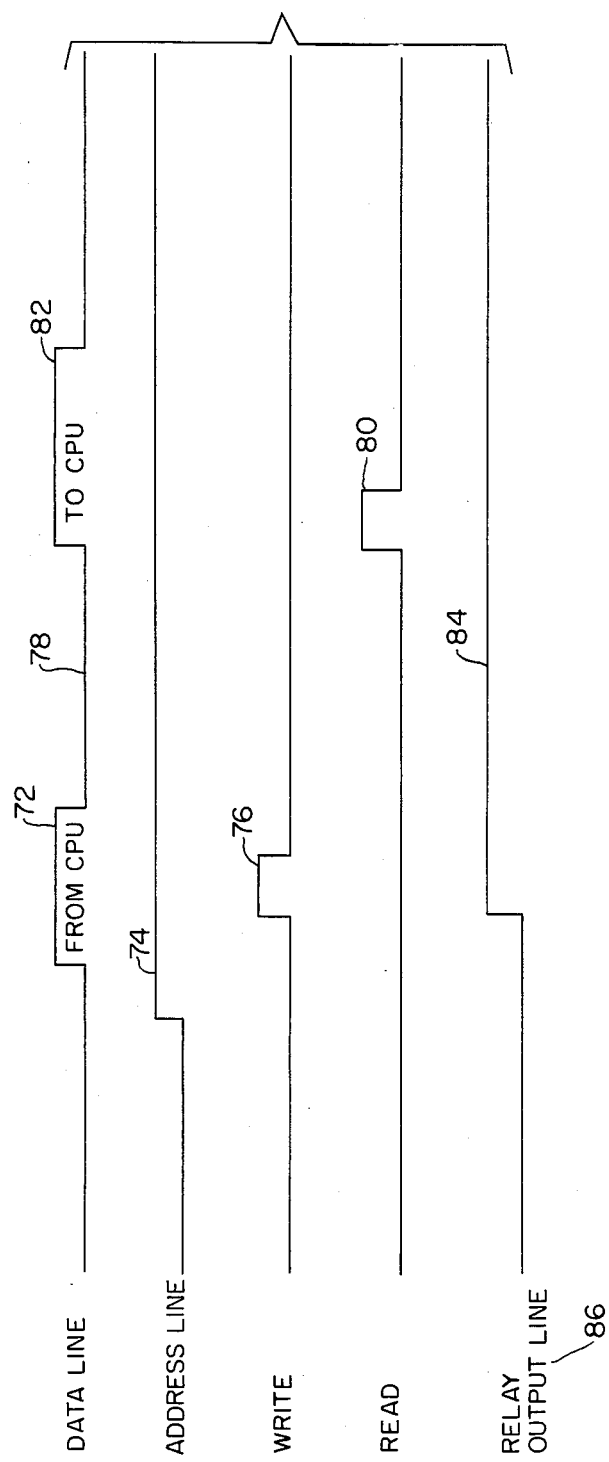
FIG. 3 shows a timing diagram of the various input/output lines of the present invention.

FIG. 3 illustrates the timing diagram of signals within the hybrid controller. As shown, a data signal 72 and an address signal 74 are generated by central processing unit 26. Once the data and address signals are found to be valid (by some comparator means such as parity checking which is well known in the computer art), a write pulse 76 is generated by central processor unit 26 and fed to select decoder 48. At that point, information contained in the data fed from line 58a would be written into whichever latch/relay driver was selected by addressing signal 74 from central processor unit 26. Next, data line 58a is turned off—this is designated as 78 on the data line. As no new address has been generated by the central processing unit, the signal on address line will remain the same. Next, the central processing unit will generate a read pulse 80, which would cause the appropriate bus driver 52a–52c to read the statuses of the relays and feed this information, designated as 82, via data lines 58a back to the central processing unit. As for the statuses of the other relays (which is represented by relay output line 86 which has only two states), it should be noted that, when write pulse 76 is generated, the relays would be set at condition 84 (again, keeping in mind that this condition can only be either "on" or "off") until it is reset by reset 66 via line 68.

In brief, although only one hybrid controller for the signal distribution system has been described at length hereinabove, it should be noted that such discussion is applicable to all of the hybrid controllers shown in FIG. 2, as they are identical. Therefore, it should be appreciated that the present invention is not to be limited to the exact details of construction shown and described herein for obvious modifications will occur to persons skilled in the art.

We claim:

1. In a signal distribution system for selectively connecting an equipment under test to a test instrument, at least one control means adapted to communicate with a central processing means for controllably activating a corresponding switching matrix means, the switching matrix means having a plurality of relays, the central processing means communicating with the control means via a plurality of bi-directional and uni-directional data lines, the control means comprising:
- a plurality of driving means connected to the bi-directional data lines and the switching matrix means;
- a decoding means connected to the driving means and the central processing means, the decoding means receiving data from the central processing means for selectively activating a particular one of the plurality of driving means for receiving instruction data from the central processing means, the particular driving means, upon being selectively activated, actuating chosen relays in the switching matrix means to controllably connect the equipment under test to the test instrument;
- means connected to the switching matrix means for sensing the statuses of the relays therein, the sensing means further being connected to the bi-directional data lines for communicating the statuses of the relays to the central processing means;
- whereby the central processing means compares the statuses of the relays which have been actuated with statuses of the relays which should be actuated to obtain a feedback as to whether or not the correct relays have been actuated.

2. The control means according to claim 1, further comprising:
- isolation means connected between the sensing means and the relays for protecting the sensing means from high voltages.

3. The control means according to claim 1, wherein the decoding means receives addressing, decoding and enabling data from the central processing means via the uni-directional data lines.

4. The control means according to claim 1, further comprising inverter means interposed between the decoding means and the driving means, the inverter means converting the outputs of the decoding means into appropriate inputs for the driving means.

5. In a signal distribution system for selectively connecting an equipment under test to a test instrument, at least one control means adapted to communicate with a central processing means for controllably activating a corresponding switching matrix means, the central processing means communicating with the control means via a plurality of bi-directional and uni-directional data lines, the control means comprising:
- a plurality of driving means connected to the bi-directional data lines and the switching matrix means, the driving means receiving instruction data from the central processing means via the bi-directional data lines;
- a decoding means connected to the driving means and the central processing means, the decoding means receiving and utilizing addressing, decoding and enabling data from the central processing means via the uni-directional lines for selectively actuvating a particular one of the plurality of driving means, the particular driving means, upon being selectively activated, actuating chosen relays in the switching matrix means in accordance to the instruction data to controllably connect the equipment under test to the test instrument;
- means connected to the switch matrix means for sensing the statuses of the relays therein, the sensing means further being connected to the bi-directional data lines for communicating these statuses of the relays to the central processing means, the central processing means comparing the statuses of the relays which are actuated with should be actuated relay information to determine whether the corrected relays have been actuated;
- isolation means connected between the sensing means and the relays for protecting the sensing means from high voltages.

6. In a signal distribution system having multiple switching matrix means for effecting connection between an equipment under test and at least one of a plurality of test instruments, and interfacing means for connecting the matrix switching means to the equipment under test, bus means connecting the switching matrix means to the test instruments, at least one control means connected to each of the switching matrix means, the control means further being connected to a central processing means, the control means comprising:
- a selecting means communicating with the central processing means via uni-directional address, decode and enable lines;
- a plurality of driving means each connected to the selecting means and the central processing means via multiple bi-directional data lines, inverter means being interposed between the central processing means and the driving means for adapting the output of the central processing means to the input of the driving means, the driving means receiving instruction data from the central processing means and at least one of the driving means being activated by the selecting means, the selectively activated driving means adapting the instruction data to actuate chosen relays in the switching matrix means, thereby effecting connection between the equipment under test and at least one of the test instruments;
- means working cooperatively with the activated driving means and connected to the corresponding switching matrix means and the central processing means for sensing from the switching matrix means and communicating to the central processing means, respectively, the statuses of the relays of the switching matrix means, the sensing means including at the output thereof an isolation means for preventing unwanted high voltages;
- whereby the central processing means compares the statuses of the actuated relays with should be actuated relay information to obtain a feedback as to whether or not the correct relays have been actuated.

7. In a signal distribution system having multiple switching matrix means for effecting a communication path between an equipment under test and a plurality of test instruments, each of the multiple switching means including a plurality of relays, the signal distribution system further having means connected to the switching matrix means for interfacing the equipment under test thereto, bus means connected to the multiple switching matrix means and the plurality of test instruments for establishing a communication link therebetween, at least one control means connected to each switching matrix means, and a central processing means connected to each control means, each control means comprising:
- a plurality of bi-directional data lines for transferring data to and from the central processing means;
- multiple controlling and driving means connected to the data lines, the controlling and driving means receiving instruction data from the central processing means;

means connected to the controlling and driving means and the central processing means for selectively actuating at least one of the controlling and driving means in accordance with addressing data received from the central processing means; whereby the selectively actuated controlling and driving means, using the instruction data, selectively activates chosen relays in corresponding switching matrix means to effect connection of the equipment under test to at least one of the test instruments; and means connected to the data lines and the relays of the multiple switching matrix means for sensing the statuses of the relays, the sensing means further communicating the statuses of the respective relays to the central processing means to ascertain whether the correct relays are activated by comparing the statuses of the actually activated relays with information on which relays should be activated.

8. The control system according to claim 7, further comprising:

isolation means connected between the sensing means the the relays for protecting the sensing means from high voltages.

9. The control system according to claim 7, wherein the selectively actuated means includes inputs for receiving decode data and enable data from the central processing means.

10. The control system according to claim 7, further comprising inverter means interposed between the selectively actuating means and the controlling and driving means.

* * * * *

UNITED STATES PATENT AND TRADEMARK OFFICE
CERTIFICATE OF CORRECTION

PATENT NO. : 4,763,124

DATED : August 9, 1988

INVENTOR(S) : Eddie T. Kovacs, et al

It is certified that error appears in the above-identified patent and that said Letters Patent is hereby corrected as shown below:

Column 2, line 46, change "t control" to --to control--.

Column 4, line 23, change "lnes" to --lines--.

Column 5, line 57, change "actuvating" to --activating--.

Column 8, line 7, change "the the" to --and the--.

Signed and Sealed this

Thirteenth Day of December, 1988

Attest:

DONALD J. QUIGG

*Attesting Officer*  *Commissioner of Patents and Trademarks*